United States Patent [19]

Kwasnick et al.

[11] Patent Number: 5,362,660
[45] Date of Patent: Nov. 8, 1994

[54] METHOD OF MAKING A THIN FILM TRANSISTOR STRUCTURE WITH IMPROVED SOURCE/DRAIN CONTACTS

[75] Inventors: Robert F. Kwasnick; George E. Possin, both of Schenectady, N.Y.; David E. Holden, Grenoble, France; Richard J. Saia, Schenectady, N.Y.

[73] Assignee: General Electric Company, Schenectady, N.Y.

[21] Appl. No.: 977,967

[22] Filed: Nov. 18, 1992

Related U.S. Application Data

[60] Division of Ser. No. 825,218, Jan. 24, 1992, Pat. No. 5,198,694, which is a continuation of Ser. No. 593,419, Oct. 5, 1990, abandoned.

[51] Int. Cl.$^5$ .......................................... H01L 21/265
[52] U.S. Cl. .................................... 437/40; 437/192; 437/981
[58] Field of Search ............... 437/40, 101, 192, 981; 148/DIG. 1, DIG. 20, DIG. 131, DIG. 161

[56] References Cited

U.S. PATENT DOCUMENTS

| | | | |
|---|---|---|---|
| 4,651,185 | 3/1987 | Holmberg et al. | 257/60 |
| 4,700,458 | 10/1987 | Suzuki et al. | 437/83 |
| 4,736,229 | 4/1988 | Holmberg et al. | 257/57 |
| 4,778,560 | 10/1988 | Takeda et al. | 156/643 |
| 4,889,983 | 12/1989 | Numano et al. | 257/53 |
| 4,918,494 | 4/1990 | Koden et al. | 257/489 |
| 5,028,551 | 7/1991 | Dohjo et al. | 437/192 |
| 5,061,648 | 10/1991 | Aoki et al. | 437/41 |

FOREIGN PATENT DOCUMENTS

| | | |
|---|---|---|
| 60-14473 | 1/1985 | Japan . |
| 60-183770 | 9/1985 | Japan . |
| 62-213278 | 9/1987 | Japan . |
| 63-190385 | 8/1988 | Japan . |
| 63-236365 | 10/1988 | Japan . |
| 1-114080 | 5/1989 | Japan . |
| 1-172026 | 12/1989 | Japan . |
| 2-082579 | 3/1990 | Japan . |
| 2134707 | 8/1984 | United Kingdom . |

OTHER PUBLICATIONS

B. Gorowitz, R. J. Saia, E. W. Balch, "Methods of Metal Patterning and Etching for VLSI" General Electric Co. Technical Information Series, Mar. 1987; See pp. 22–25, also published in VLSI Electronics Microstructure Science (N. Einspruch, S. Cohen, G. Gildenblat, Eds.) vol. 15, Chap. 4, p. 159(1987).

R. J. Saia, B. Gorowtiz, "The Reactive Ion Etching of Molybdenum and Bilayer Metallization Systems Containing Molybdenum," Journal of the Elctrochemical Society, vol. 135, pp. 2795-2802 (Nov. 1988) (See p. 2797 for discussion of one step MO-CR etching).

Y. Kuo, J. Crowe, "Slope Control of Molybdenum Lines Etched With Reactive Ion Etching," J. Vac. Sci. Technical, pp. 1529-1532 (May/Jun. 1990) (See p. 1529 for discussion of MO etching).

R. Kwasnick, G. Possin, R. Saia, "Reactive Ion Etched MO/CR Source-Drain Metallization For Amorphous Silicon Thin Film Transistors," Materials Res. Soc, Symposium Proc. Apr. 1991.

Primary Examiner—Tom Thomas
Assistant Examiner—C. Chaudhari
Attorney, Agent, or Firm—Donald S. Ingraham; Marvin Snyder

[57] ABSTRACT

Minimum line spacing is reduced and line spacing uniformity is increased in thin film transistors by employing source/drain metallization having a first relatively thin layer of a first conductor and a second relatively thick layer of a second conductor. The second conductor is selected to be one which may be preferentially etched in the presence of the first conductor whereby the first conductor acts as an etch stop for the etchant used to pattern the second conductor portion of the source/drain metallization. This etching is preferably done using dry etching. Dry etching typically provides substantially better control of line width than wet etching. The etching of the second conductor can be done with a dry etch process which etches the photoresist at substantially the same rate as the second conductor whereby the second conductor is provided with a sidewall slope of substantially 45° which improves the quality of passivation provided by subsequent deposition of a conformal passivating layer.

6 Claims, 11 Drawing Sheets

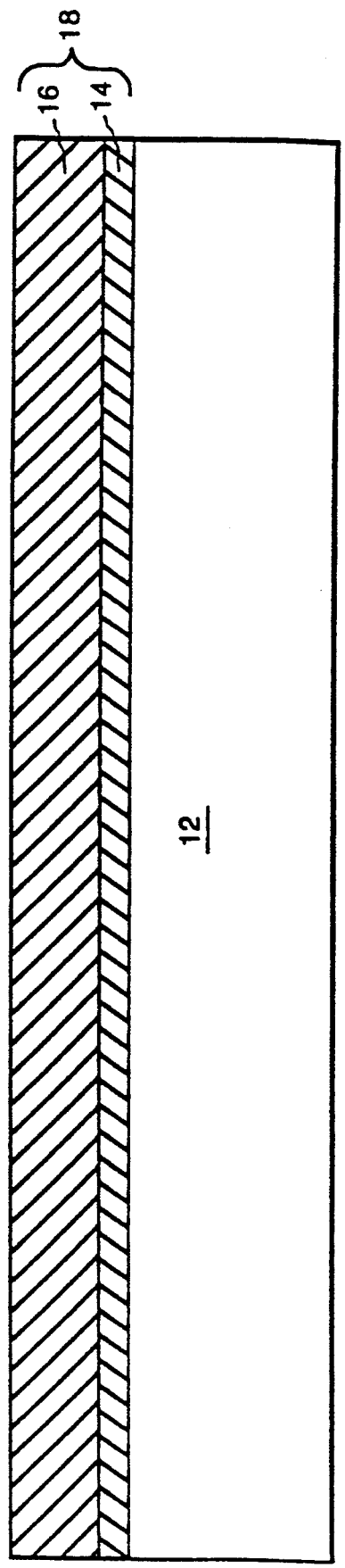
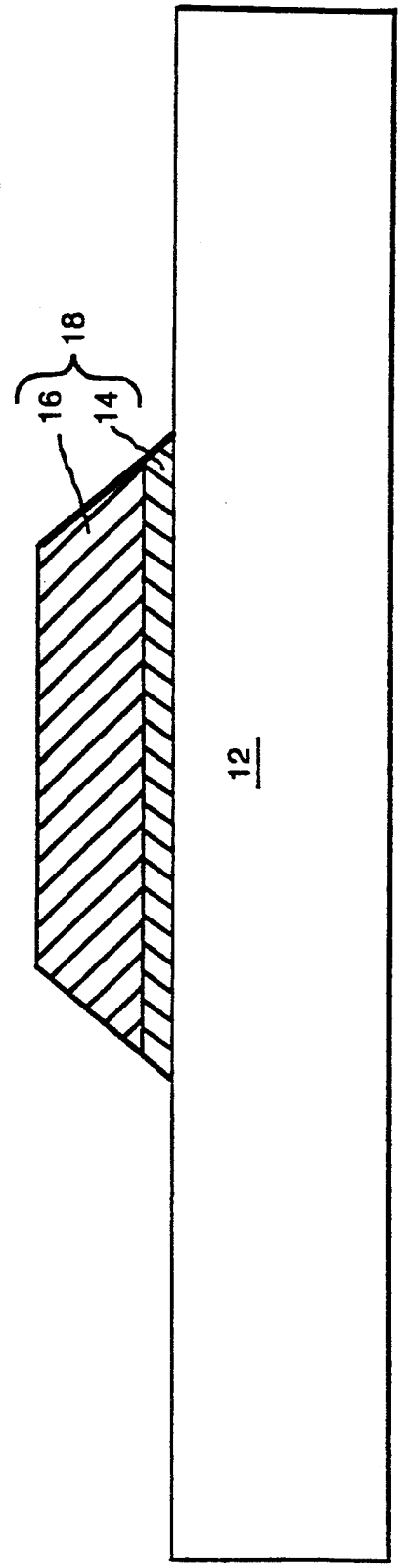

METHOD OF MAKING A THIN FILM TRANSISTOR STRUCTURE WITH IMPROVED SOURCE/DRAIN CONTACTS

RELATED APPLICATIONS

This application is a division of application Ser. No. 07/825,218, filed Jan 24, 1992 now U.S. Pat. No. 5,198,694, which is a continuation of application Ser. No. 07/593,419, filed Oct. 5, 1990, now abandoned.

The present application is related to application Ser. No. 07/593,425 now abandoned, filed Oct. 5, 1990, entitled "Device Self-Alignment by Propagation of a Reference Structure's Topography", by C-Y Wei, et al.; application Ser. No. 07/593,423 now abandoned, filed Oct. 5, 1990, entitled, "Positive Control of the Source/Drain-Gate Overlap in Self-Aligned TFTs Via a Top Hat Gate Electrode Configuration", by C-Y Wei, et al.; application Ser. No. 07/593,421 now abandoned, filed Oct. 5, 1990, entitled, "Thin Film Transistor Having an Improved Gate Structure and Gate Coverage by the Gate Dielectric" by R. F. Kwasnick, et al.; application Ser. No. 07/510,767, now U.S. Pat. No. 5,130,263 filed Apr. 17, 1990, entitled "Method for Photolithographically Forming a Self-Aligned Mask Using Back Side Exposure and a Non-Specular Reflecting Layer", by G. E. Possin, et al.; and application Ser. No. 07/499,733, now U.S. Pat. No. 5,010,027 filed Mar. 21, 1990, entitled "Method for Fabricating a Self-Aligned Thin-Film Transistor Utilizing Planarization and Back-Side Photoresist Exposure", by G. E. Possin, et al., filed Mar. 21, 1990, each of which is incorporated herein by reference.

BACKGROUND OF THE INVENTION

1. Field of the Invention

The present invention relates to the field of thin-film transistors and more particularly to the field of thin-film transistor metallization.

2. Background Information

Amorphous silicon (a-Si) thin-film transistors (TFTs) are used in both display and imager applications. These field effect transistors (FETs) are primarily used in array devices in which the electro-optically active portion of the devices comprises many individual pixels the electro-optical state of which must be individually set or read in accordance with the display or imager nature of the device. As such, such TFTs are fabricated in large quantities, in small sizes and in substantial densities on the substrates for such systems. For optimum system operation, every one of the TFT's in the array should have identical characteristics. While absolutely identical characteristics are probably unobtainable, there is presently a substantial problem with excessive variations in TFT characteristics across an entire array and even more so across an entire wafer. In particular, because of processing variations, the thin-film transistors in one portion of an array may have significantly different characteristics than the thin-film transistors in another portion of the array. Such variations in characteristics unduly restrict the maximum operating characteristics of the array (speed, signal to noise ratio, sensitivity and so forth). A parameter in which variation across a wafer is common is the spacing between the source and drain electrodes of the TFTs. Such variations have a number of undesirable effects. A larger source-to-drain electrode spacing translates directly into a larger source-to-drain region spacing which in turn results in reduced off-state capacitance for the thin film transistor. Another effect of increased source-to-drain electrode spacing is a reduction in the current provided by the transistor in response to a given set of gate and source-to-drain voltages. This reduction in current can decrease the speed of a liquid crystal display or increase the noise in an imaging device. Consequently, there is a need for improved thin-film transistor structures and methods of processing them which reduce, minimize or eliminate significant variations in the source-to-drain-electrode spacing of thin-film transistors across an array with a consequent reduction in variations in capacitance and current output. It is normal practice in the thin film transistor art to employ wet etchants to etch the source/drain metallization because such wet etchants are available which are highly selective between the source/drain metallization and the immediately underlying amorphous silicon which comprises the semiconductor material of the thin-film transistor. This use of wet etchants makes it possible to completely remove the source/drain metallization from the channel region of the transistor's semiconductor material without significant etching of the semiconductor material itself. Unfortunately, use of wet etching limits the main source-to-drain-electrode spacing due to linewidth loss from undercutting. Still worse, because the undercutting of the photoresist by the etchant is non-uniform and uncontrollable, such spacings vary significantly from lot to lot and in different portions of the same array. A source/drain metallization structure which is photoresist defined with a three micron spacing can end up after completion of the wet etch with as much as a four or five micron spacing. Still worse, this spacing typically varies across a given array.

A layer of chromium or a layer of molybdenum is commonly used as the source/drain metallization for thin-film transistors because each of them makes good ohmic contact to n+ amorphous silicon. These metallizations are typically deposited by sputtering. A common wet etchant for molybdenum is known as PAWN (phosphoric acid, acetic acid, water and nitrite acid). Such wet etchants have the unfortunate characteristic for thin-film transistors of patterning molybdenum with vertical sidewalls. As is well known in the semiconductor art, vertical sidewalls make it substantially more difficult to successfully passivate a structure with a deposited layer such as silicon dioxide or silicon nitride as compared to the same structure with sloped sidewalls. Non-continuous passivation can cause damage to lower layers while etching subsequently deposited layers of material.

A plasma or reactive ion etch (RIE) process can provide the required uniform source/drain metal spacings since such processes can be anisotropic in nature. In applications where a large area needs to be patterned, as in the case of an 8"×8" liquid crystal display, typical RIE edge to center clearing, commonly referred to as the "bull's eye effect", can result in excessive and non-uniform removal of the underlying material, which in this application is silicon. The "bull's eye effect" becomes worse with increases in the thickness of the material being etched, and with the size of the part being etched.

Due to the aforementioned problems, there is a need for: a) an improved thin film transistor structure and fabrication process which provides the ability to produce more uniform source/drain spacings across an entire array or structure, b) the ability to produce smaller spaces between the source and drain electrodes in the vicinity of the channel region of a thin film transistor, c) an etching process which produces a source/drain metallization with a sloped sidewall profile so that subsequently deposited layers can more successfully passivate that structure and d) an etch process which patterns the source/drain metal without excessive and non-uniform removal of the underlying material.

OBJECTS OF THE INVENTION

Accordingly, a primary object of the present invention is to provide a thin film transistor structure which may be accurately and uniformly reproduced across an entire array or structure.

Another object of the present invention is to provide a thin film transistor fabrication process which results in closer control of source/drain region spacing.

Another object of the present invention is to provide a thin film transistor fabrication process which produces source/drain metallization having sloped sidewalls which facilitate high integrity conformal deposition of overlying passivation layers.

Another object of the present invention is to provide a thin film transistor fabrication process which patterns the source/drain metallization without excessive and non-uniform removal of the underlying materials.

SUMMARY OF THE INVENTION

The above and other objects which will become apparent from the specification as a whole including the drawings, are accomplished in accordance with the present invention by providing a two layer source/drain metallization structure in which a first relatively thin layer of a first conductor is disposed directly on the underlying amorphous silicon material and a second relatively thick layer of a second conductor which is disposed directly on the first conductor with the second conductor being one which can be preferentially etched in the presence of the first conductor.

In accordance with one method of fabricating such a thin film transistor, the thin film transistor is fabricated up to deposition of the source/drain metallization in a normal fashion. A first thin layer of a first conductor which preferably makes good ohmic contact to the semiconductor material is deposited directly on the semiconductor material. Thereafter, preferably without breaking vacuum in the deposition apparatus, a second thicker layer of a second conductor is deposited on the first conductor. A photoresist mask is then formed on top of the source/drain metallization with a pattern of open areas which leaves the source/drain metallization exposed where it is desired to remove the source/drain metallization. The structure is then preferably dry etched using reactive ion etching with an etchant gas which etches the second conductor much faster than it etches the first conductor. The second conductor is overetched in the sense of the etching process being continued for a period of time after it is determined that the first conductor has been exposed in the openings in the mask. This overetching is to ensure the complete removal of the second conductor in all of these openings all across the wafer and particularly all across each of the individual thin film transistor arrays being fabricated. Thereafter, the source gas for the reactive ion etching is changed to one which etches the first conductor. This second etchant source gas is preferably one which provides etch selectivity to the underlying semiconductor material. However, because the first conductor layer is relatively thin, the etch selectivity to the underlying material can be lower than that which would be required if the first conductor were omitted since the uniformity of metal clearing is greater with thinner films and the time that the underlying material is exposed to the etching gas is shorter.

Following etching of the first conductor, the fabrication of the thin film transistor is completed in the normal fashion.

The first conductor is preferably chromium, while the second conductor is preferably molybdenum. The etching gas for the second conductor (Mo) is preferably a mixture of $SF_6$, $Cl_2$ and $O_2$ and the etching gas for the first conductor (Cr) is preferably a mixture of $Cl_2$ and $O_2$.

BRIEF DESCRIPTIONS OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

FIGS. 1–12 illustrate successive stages in the fabrication of a thin-film transistor in accordance with the present invention.

DETAILED DESCRIPTION

FIG. 1 is a cross-sectional view of a substrate 12 on which a plurality of thin-film transistors are to be fabricated. A layer of gate metallization 18 is disposed across the entire upper surface of the illustrated portion of the substrate 12. This gate metallization preferably comprises two separate sublayers 14 and 16, but may be a single layer of one conductor if desired. This gate metallization is then patterned in accordance with any of a variety of known techniques to provide the structure illustrated in FIG. 2 where the gate metallization 18 is now restricted to those locations in which gate metallization is required in the final structure. This patterning process may preferably be done photolithographically with photoresist and a wet or dry etchant in accordance with a particular gate metallization employed and the practitioner's preferences. In accordance with related application Ser. No. 07/593,423, the gate metallization 18 may preferably be a two-layer gate metallization of molybdenum over chrome and may preferably be patterned by reactive ion etching to provide a sloped sidewall on the gate metallization as explained more fully in that application.

Figure 3:
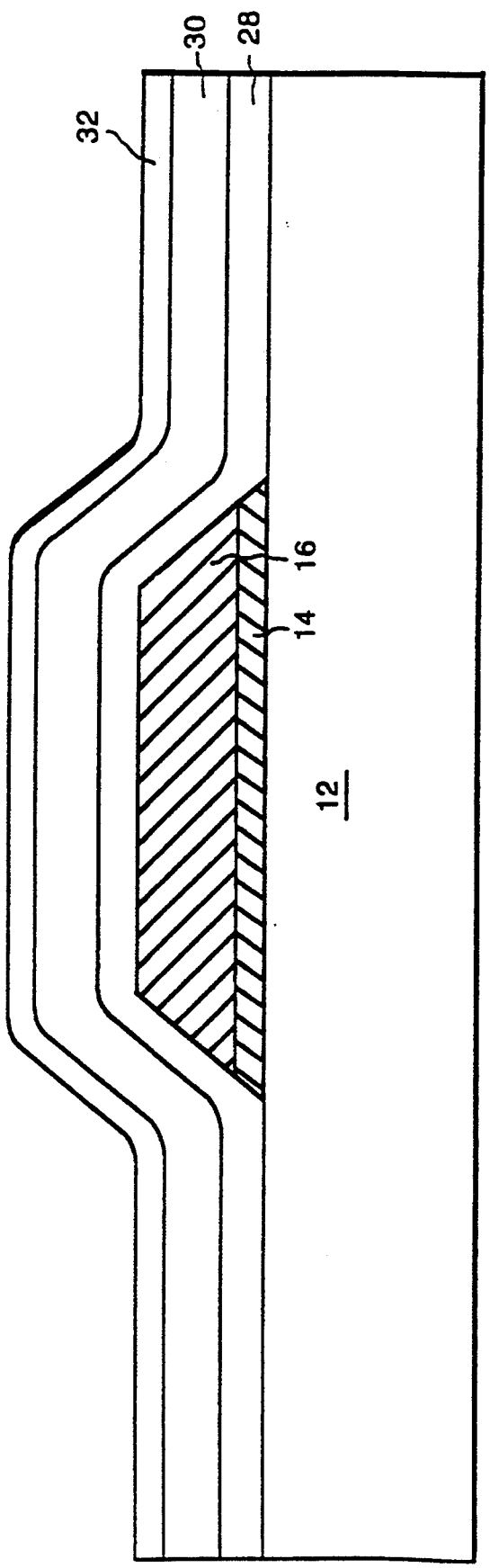

Following patterning of the gate metallization 18, a gate dielectric layer 28 is deposited across the entire upper surface of the substrate and gate metal. Coverage at the edges of the gate metal is improved by providing a sloped gate metallization in accordance with the teachings of related application Ser. No. 07/593,421. The gate dielectric is preferably 0.1 to 0.5 microns thick. Next, a layer 30 of intrinsic amorphous silicon from 0.1 to 0.5 microns thick is deposited on the gate dielectric layer without breaking the vacuum in the deposition chamber. Next, a layer 32 of n+ amorphous silicon from 0.01 to 0.1 microns thick is deposited on top of the intrinsic silicon 30, again without breaking the vacuum in the deposition chamber. The structure at the end of these steps is illustrated in FIG. 3.

Next the n+ amorphous silicon and the intrinsic amorphous silicon are masked and removed by etching in areas outside the region where the FET will be subsequently defined. This is normally necessary to permit the formation of other elements such as liquid crystal pixels or light detecting elements adjacent to the transistors. It also results in electrical isolation of the individual FETs. A thin metal layer preferably about 500 Å of Mo may be deposited on the silicon before this masking and etching and subsequently removed after the etching of the silicon to protect the quality of the retained silicon. This etching of the silicon is preferably done with sloped sidewalls. The structure at the end of this step is illustrated in FIG. 4.

Figure 4:
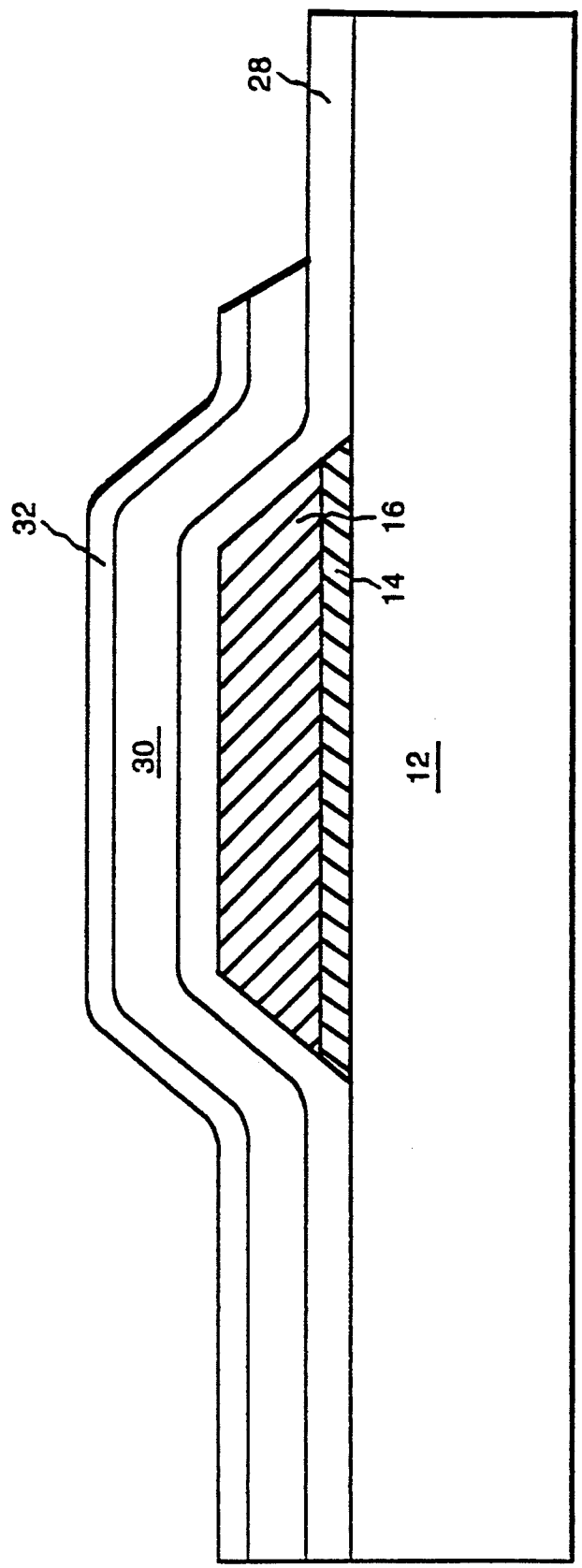
Figure 5:
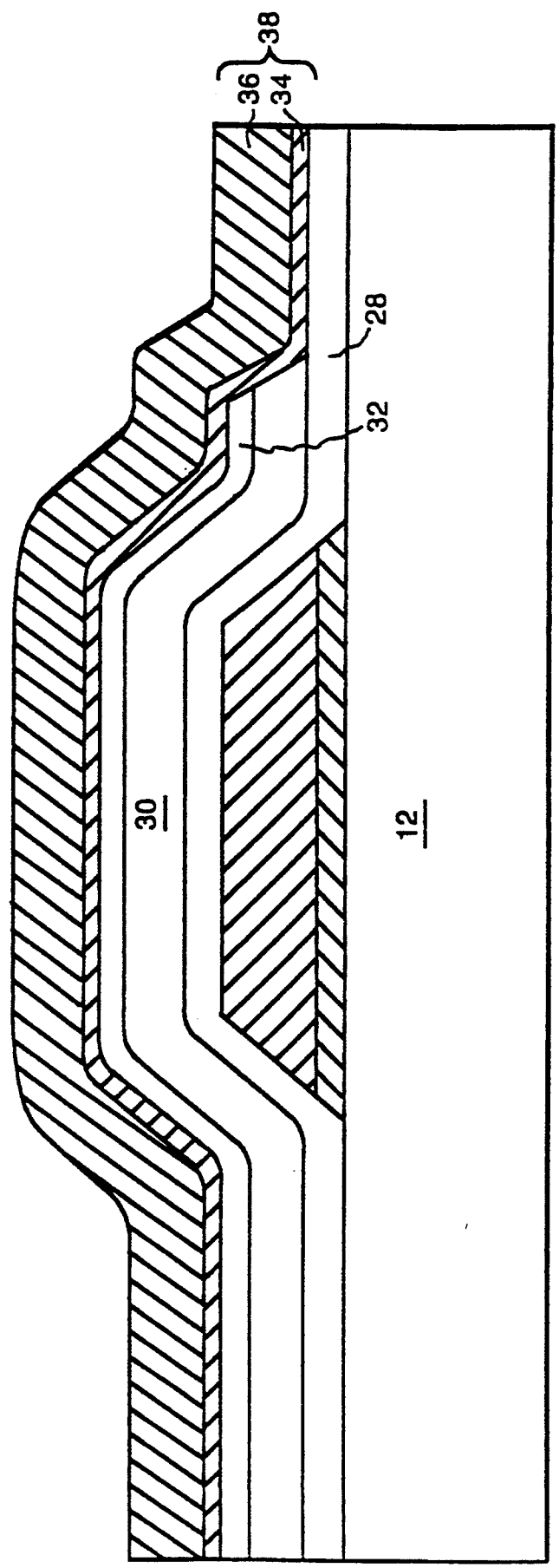

The structure illustrated in FIG. 4 is ready for the deposition of the source/drain metallization for this thin-film transistor. In accordance with the invention, a first relatively thin layer 34 (0.01 to 0.1 microns thick) of a first conductor is deposited directly on the n+ amorphous silicon. This first conductor is preferably chromium but may also be nichrome, tantalum or other appropriate metals which make good ohmic contact to n+ amorphous silicon and which preferably can be preferentially etched with respect to at least intrinsic amorphous silicon. Next, a relatively thick layer 36 of a second conductor is deposited on the first conductor 34. This second conductor is preferably molybdenum, but may also be aluminum or tungsten. This second conductor is preferably deposited by sputtering to a thickness of from 0.1 to 1 microns. One of the benefits of using molybdenum as this second conductor is the fact that it is significantly more conductive than the underlying chromium with the result that the source/drain metallization 38 has a higher conductivity than it would if the entire source/drain metallization were chromium. For imager applications, another advantage of the use of molybdenum as a second conductor is the fact that it makes good ohmic contact to n+ amorphous silicon which is deposited on the source/drain metallization as part of the imager fabrication process. For non-imager applications, aluminum may be considered preferable to molybdenum because of the aluminum's higher conductivity. The device structure at the end of the deposition of the source/drain metallization 38 is illustrated in FIG. 5.

Figure 6:
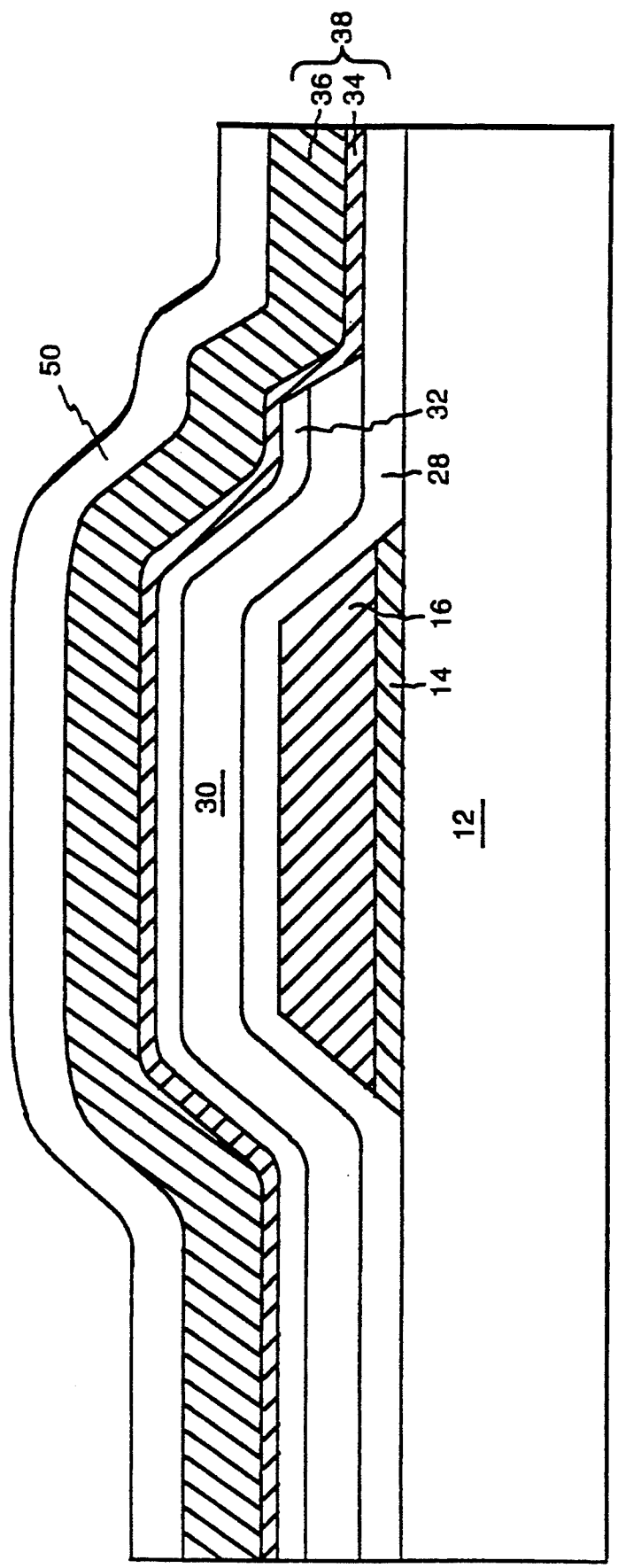
Figure 7:
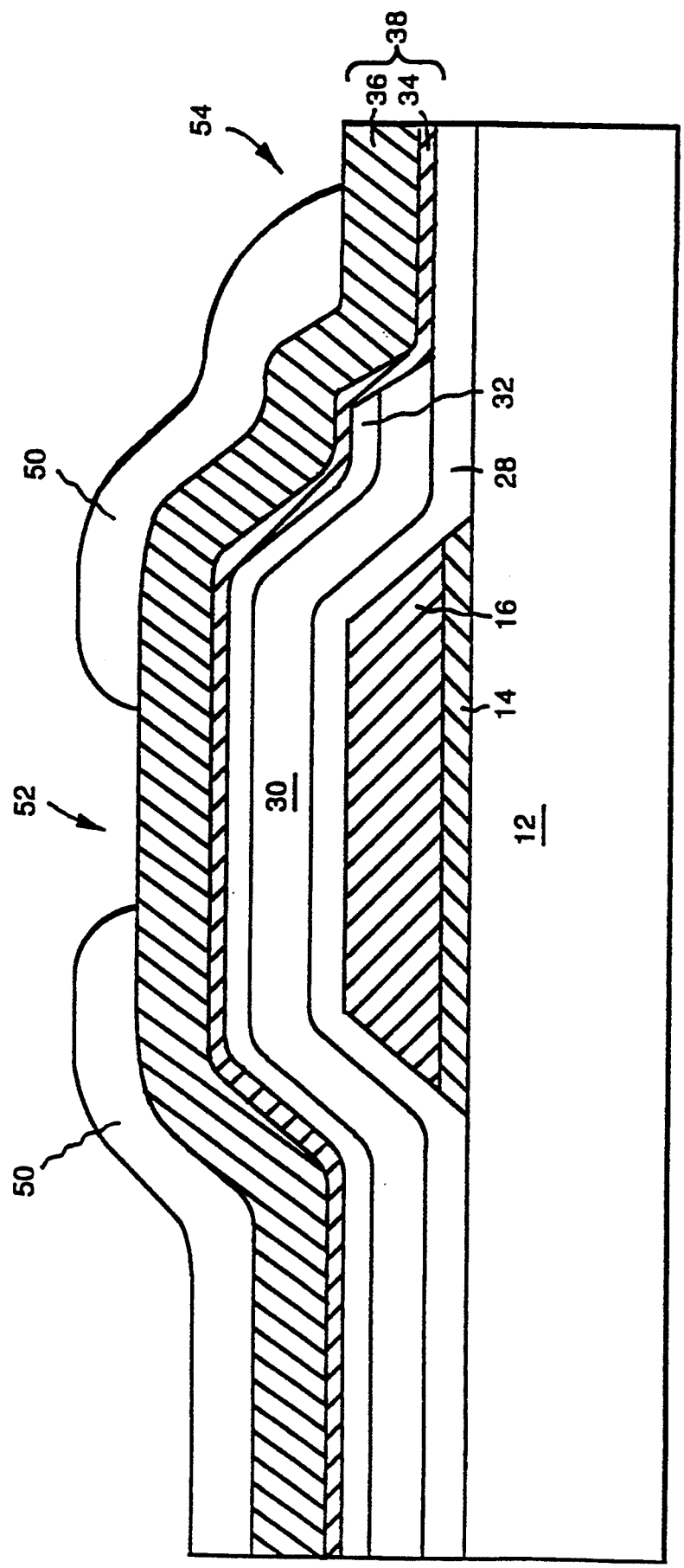

Next, a layer of photoresist 50 is formed on the upper surface of the source/drain metallization as shown in FIG. 6. This photoresist is then photolithographically patterned and developed to provide openings 52 with a sidewall slope of about 45° in alignment with the desired location of the channel region of the thin film transistor and openings 54 with a sidewall slope of about 45° in those locations where the source/drain metallization is to be removed in order to isolate different transistors, electrodes and so forth. The device structure at the end of this step is illustrated in FIG. 7.

Figure 8:
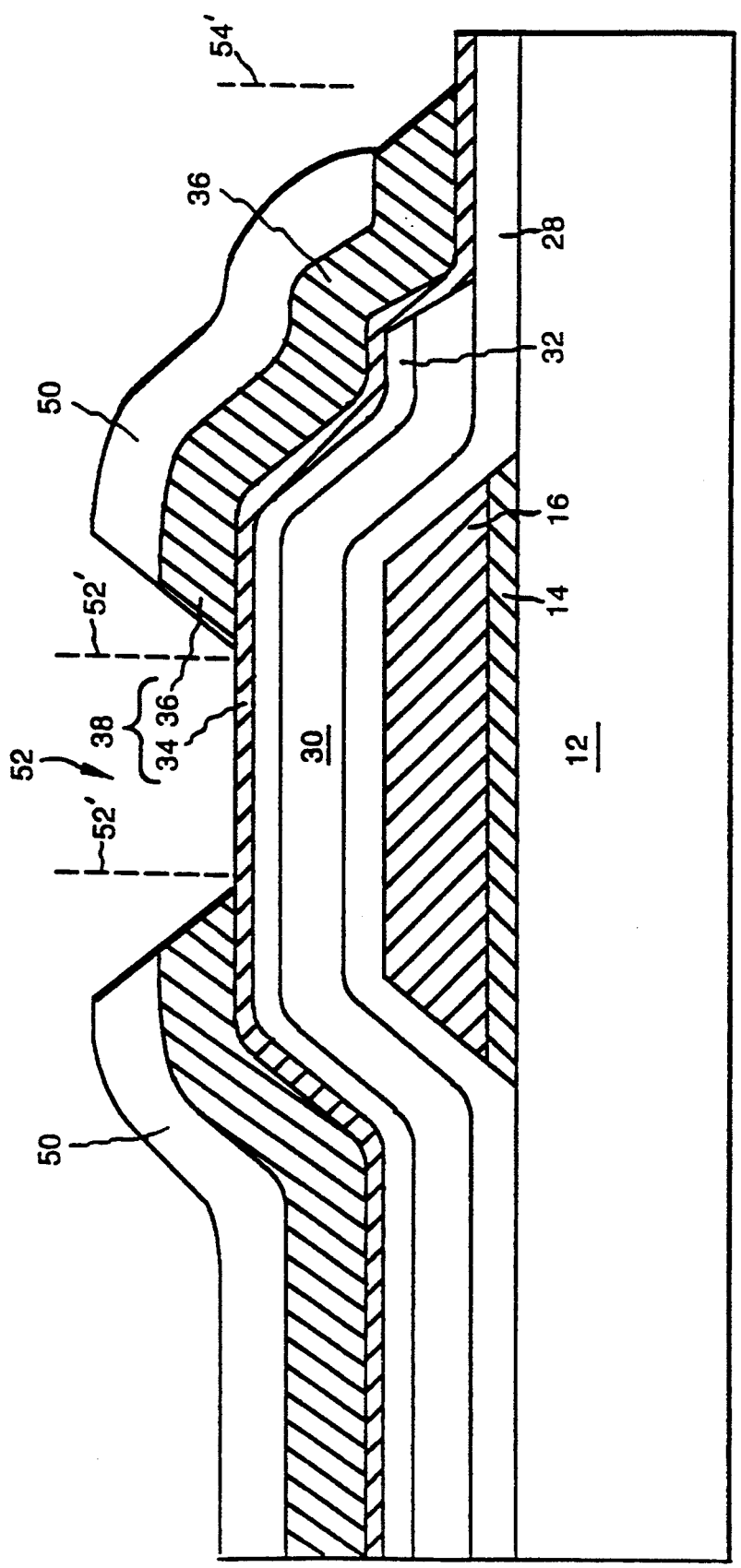
Figure 9:
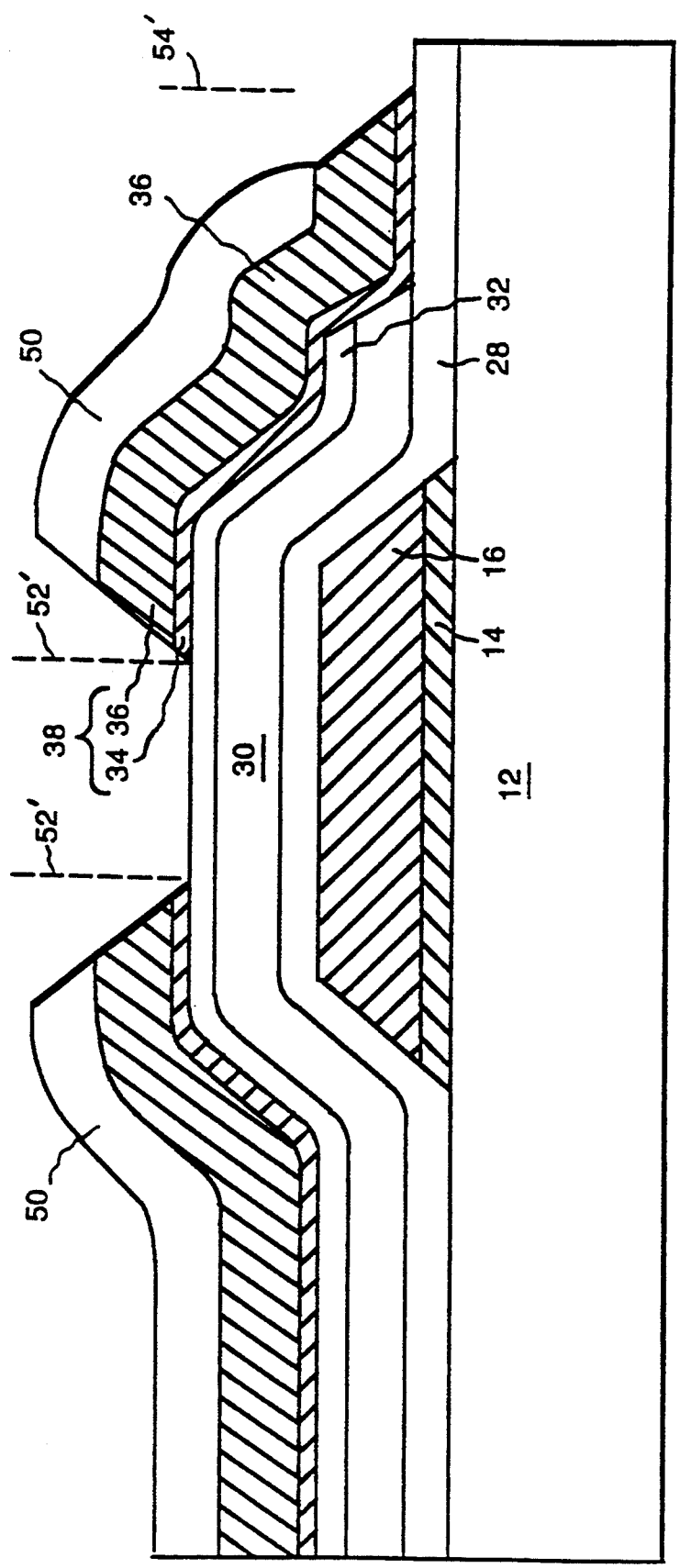

At this stage, the wafer is mounted in a reactive ion etching apparatus which is then purged and evacuated in accordance with normal reactive ion etching procedures. A source gas flow of preferably 37.5 sccm (standard cubic centimeters per minute) of sulfur hexafluoride (SF$_6$), 6.5 sccm of Cl$_2$ and 16 sccm of O$_2$ is established, introduced into the etching chamber at a pressure of 65 mtorr and converted into a plasma state by Rf power. The resulting plasma etches the molybdenum in the openings 52 and 54. This etching is preferably carried out until all the molybdenum is removed in center of the windows and is allowed to proceed for an additional 10% of that time to ensure that all of the molybdenum is removed from within the originally defined windows 52 and 54. This molybdenum etching step is preferably carried out at a power of 0.17 Watts/cm$^2$, to provide an etch rate of Mo:photoresist close to 1:1. The device structure at the end of this step is illustrated in FIG. 8. The presence of the chromium etch stop layer is particularly important where the etchant used for the molybdenum layer would etch the silicon at a comparable or faster rate than it etches the molybdenum if that silicon were exposed during the molybdenum etching. The dashed lines 52' and 54' illustrate the original location of the openings 52 and 54 respectively. It will be noted, that the underlying chromium is exposed substantially in alignment with the original window 52 or 54 and that the overlying molybdenum has a sidewall slope of substantially 45 degrees and the photoresist has been etched back from the original edge 52' or 54' of the window to the top of the molybdenum slope. Next, the etchant gas is preferably changed to 70 sccm Cl$_2$ and 30 sccm O$_2$ at a pressure of 100 mtorr to remove the exposed chromium. This etch is preferably continued until all the exposed chromium appears to have been removed and is then continued for an additional 60 seconds to ensure complete removal of the exposed chromium. This etching step is preferably carried out at a power of 0.25 watts/cm$^2$. Only at most a few hundred angstroms of silicon is removed during this step. The structure at the end of this chromium etching step is illustrated in FIG. 9.

Figure 10:
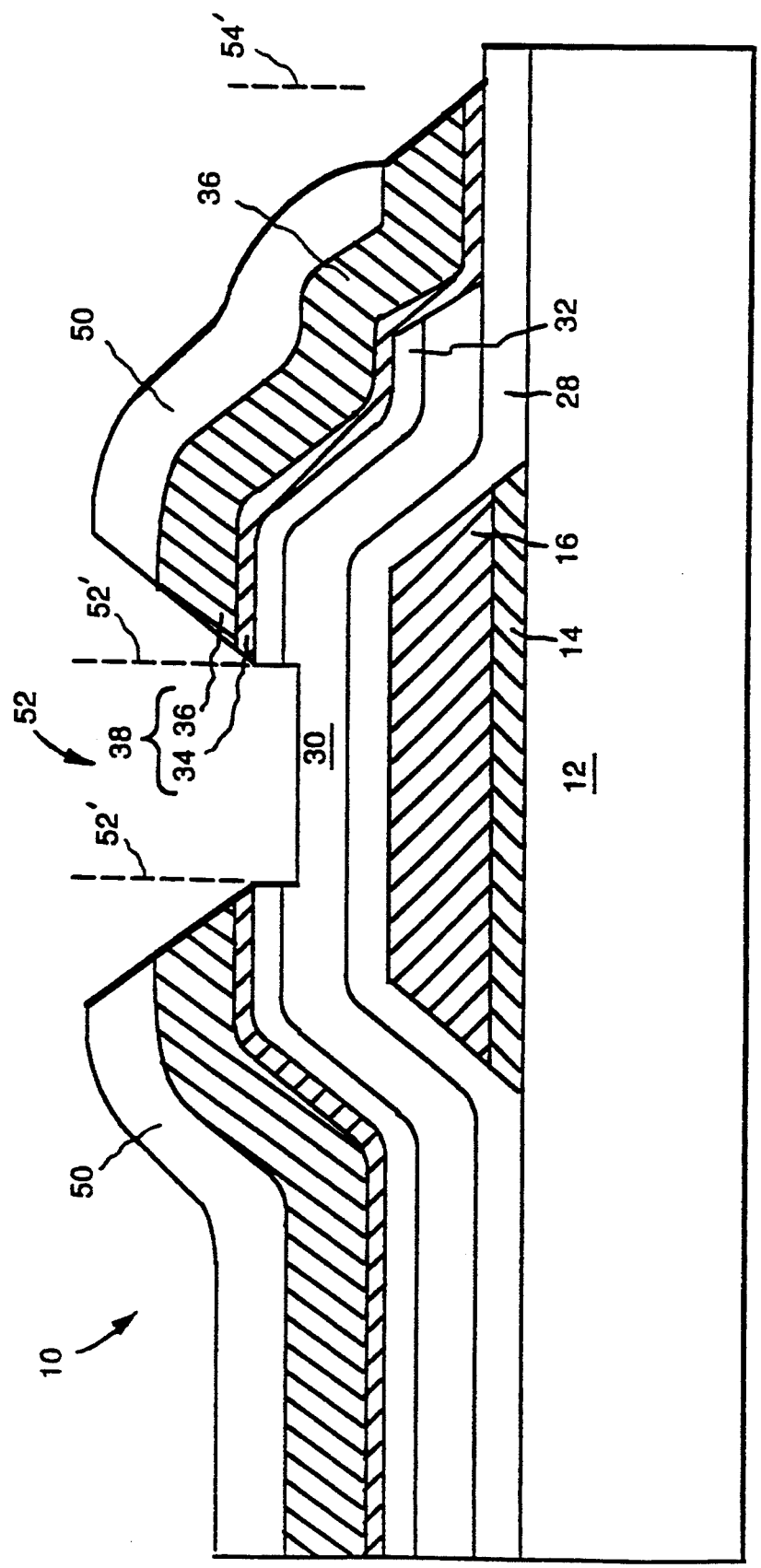

Next, the n+ amorphous silicon is etched from the channel region of the structure, that is in the windows 52. During this etch, some of the intrinsic amorphous silicon must also be removed to ensure that all of the doped amorphous silicon has been removed. Since the n+ amorphous silicon is uniform after the chromium etch, a short timed etch to subsequently remove the n+ silicon 32 from over the intrinsic amorphous silicon 30 leaves a substantially uniform intrinsic amorphous silicon layer. The structure at the end of this step is illustrated in FIG. 10.

Figure 11:
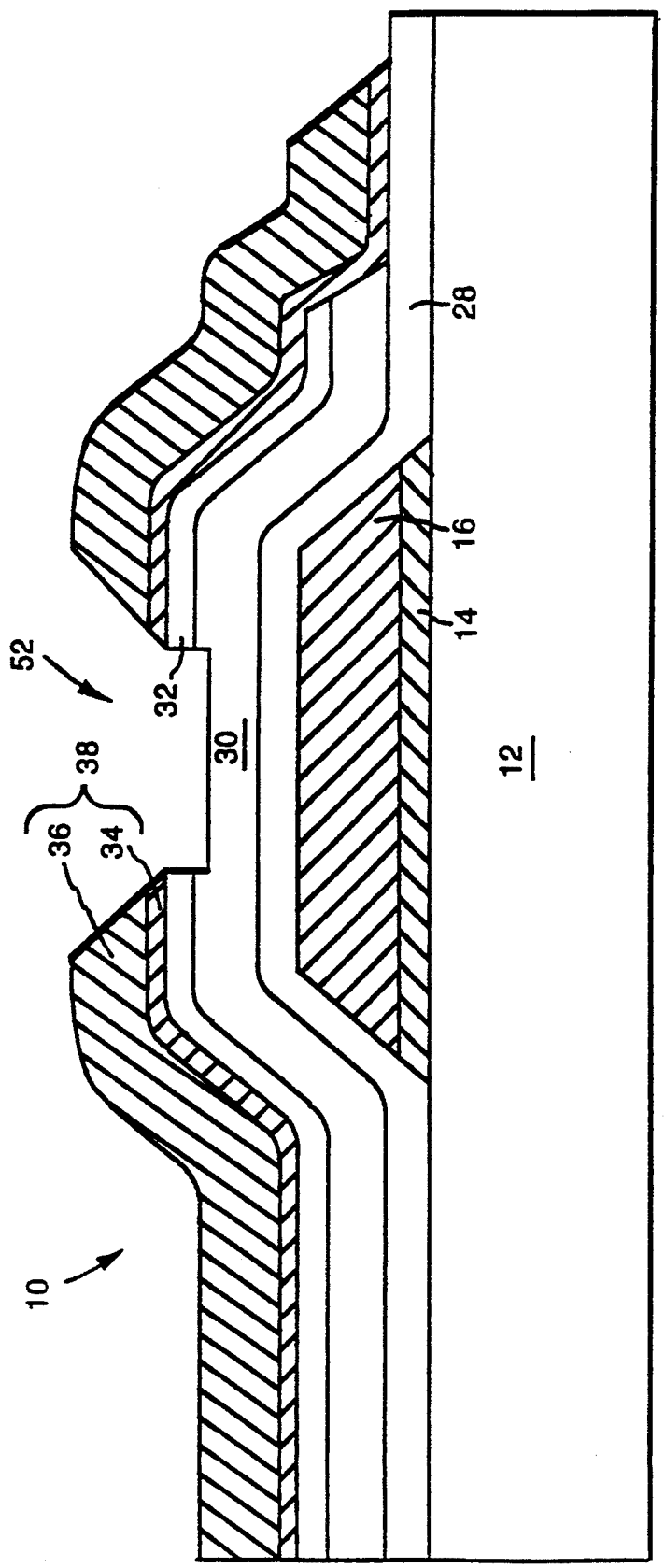
Figure 12:
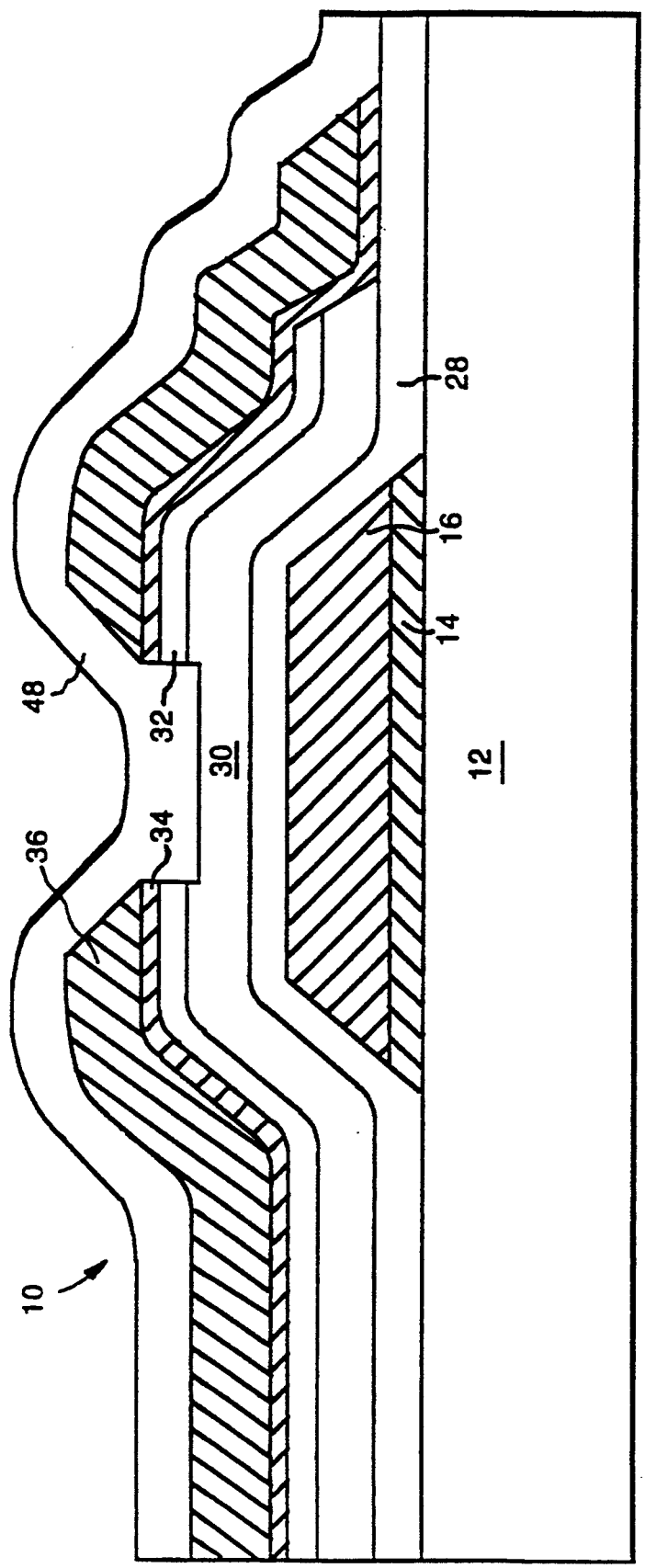

The photoresist is now stripped to provide the structure illustrated in FIG. 11 where the source/drain metallization has its desired final configuration as does the thin film transistor. A passivation layer 48, commonly known as a back channel passivation layer, is preferably conformally deposited on the entire upper surface of the wafer as shown in FIG. 12. This passivation layer 48 provides excellent coverage at the edges of the source/drain metallization due to the sloped sidewall of the source/drain metallization and the thinness of the n+ amorphous silicon layer which may have vertical sidewalls without producing an adverse affect on passivation because of its height of only 0.02 to 0.15 microns. At this point, fabrication of the thin film transistor is essentially complete and the process continues with normal processing and patterning for such structures at this stage. Such further steps may include opening contact windows to the source and drain metallizations and the gate metallizations as is appropriate to the overall device structure. If the device is to be an imager with semiconductor imaging devices disposed directly on the thin film transistors, then the process proceeds to the fabrication of those devices in their normal fashion.

While specific metals for use as the conductors have been identified, other metals or other non-metal conductors may be employed as is considered desirable in particular structures. The important thing being that the second conductor can be etched with an etchant which does not significantly etch the first conductor whereby the first conductor acts as an etched stop for the etching of the second conductor and that the first conductor be sufficiently thin, if there is not a selective etchant for it relative to the semiconductor material disposed directly thereunder, that the amount of overetching required to ensure the removal of the first conductor does not unacceptably remove the semiconductor material thereunder.

Typically, the illustrated thin film transistor is only one of many such thin film transistors which are simultaneously fabricated on the same substrate.

While the semiconductor material in the just described embodiment is amorphous silicon, since that is the material presently in typical use for thin film transistors, it should be understood that this process is equally applicable to the use of other semiconductor materials or other forms of silicon. Further, while the gate dielectric layer has been described as being silicon nitride, it will be understood that more than one sublayer may be present in the gate dielectric layer and various sublayers may have different compositions and a single layer dielectric may comprise $SiO_2$ or other dielectric materials.

Other semiconductor materials which are presently used in an amorphous condition are germanium and cadmium selenide. This process technique is applicable to those amorphous silicon semiconductor materials and any others as well as being applicable to polycrystalline or even monocrystalline semiconductor materials where the underlying support structure supports the formation of such semiconductor layers.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A method of fabricating a thin film transistor comprising:

partially fabricating said thin film transistor up to deposition of a source/drain metallization layer, the partially fabricated thin film transistor having an upper surface comprising silicon;

depositing a relatively thin first layer of a first conductor on the partially fabricated transistor, said first conductor comprising chromium;

depositing a relatively thick second layer of a second conductor on said first conductor, said second conductor comprising molybdenum;

masking said second conductor in a desired pattern of said source/drain metallization layer;

etching said second conductor with a second conductor etchant, said second conductor etchant being selected such that the first conductor comprises an etch stop therefor, said second conductor etchant further being capable of etching silicon at a rate that is not substantially less than the rate said second conductor etchant etches said second conductor;

etching said relatively thin first conductor with a first conductor etchant, said first conductor etchant being selected such that the silicon upper surface of said partially fabricated thin film transistor comprises an etch stop therefor; and finishing the fabrication of said thin film transistor.

2. The method recited in claim 1 wherein:

the step of masking comprises forming a photoresist mask; and said second conductor etchant further being selected to etch said photoresist at substantially the same rate as said second conductor whereby said second conductor is patterned with a sloped sidewall.

3. The method recited in claim 1 wherein:

said etchant for said second conductor etches said second conductor at least 10 times as fast as it etches said first conductor.

4. The method recited in claim 1 wherein the steps of depositing said layer of said first conductor and depositing said layer of said second conductor are sequentially performed in an evacuated deposition apparatus without breaking vacuum.

5. The method recited in claim 1 wherein:

each of said etchants comprises a plasma, and said first and second conductors are sequentially etched by said etchants in an evacuated reactive ion etching apparatus without breaking vacuum.

6. The method as recited in claim 1 wherein:

each of said etchants comprises a plasma, and said first and second conductors and said partially fabricated thin film transistor are sequentially etched by said etchants in an evacuated reactive ion etching apparatus without breaking vacuum.

* * * * *